(12) United States Patent
Morand

(10) Patent No.: US 6,577,182 B1
(45) Date of Patent: Jun. 10, 2003

(54) DEVICE FOR DEMODULATING AN AMPLITUDE-MODULATED SIGNAL

(75) Inventor: Sébastien Morand, Vallauris (FR)

(73) Assignee: Ask S.A., Sophia Antipolis (FR)

( * ) Notice: Subject to any disclaimer, the term of this patent is extended or adjusted under 35 U.S.C. 154(b) by 0 days.

(21) Appl. No.: 09/868,854

(22) PCT Filed: Oct. 26, 2000

(86) PCT No.: PCT/FR00/02982

§ 371 (c)(1),
(2), (4) Date: Aug. 27, 2001

(87) PCT Pub. No.: WO01/31776

PCT Pub. Date: May 3, 2001

(30) Foreign Application Priority Data

Oct. 28, 1999 (FR) .............................. 99 13852

(51) Int. Cl.[7] .................................. H03D 1/00
(52) U.S. Cl. ................. 329/347; 329/349; 329/353
(58) Field of Search ................. 329/347, 349, 329/353

(56) References Cited

U.S. PATENT DOCUMENTS

| 4,280,175 A | | 7/1981 | Leuthold | 363/127 |
|---|---|---|---|---|
| 4,723,113 A | | 2/1988 | Marcoux | 331/76 |
| 4,856,095 A | * | 8/1989 | Rauscher | 359/190 |
| 6,031,419 A | * | 2/2000 | Roberts et al. | 329/349 |
| 6,198,361 B1 | * | 3/2001 | Arisawa | 332/115 |
| 6,213,402 B1 | * | 4/2001 | Reiner | 235/492 |
| 6,323,728 B1 | * | 11/2001 | Schmitt-Landsiedel et al. | 329/347 |

FOREIGN PATENT DOCUMENTS

| EP | 219366 | 4/1987 |
|---|---|---|
| FR | 2461395 | 1/1981 |
| WO | WO 99/42948 | 8/1999 |

* cited by examiner

Primary Examiner—Michael Tokar
Assistant Examiner—Khai M. Nguyen
(74) Attorney, Agent, or Firm—James C. Lydon

(57) ABSTRACT

A device for demodulating a modulated signal resulting from an amplitude modulation of a sinusoidal signal of frequency $f_o$ by a signal of frequency $f_m$ according to an unknown modulation rate, comprising a transistor (10) where the gate is connected to the modulated signal ($E_t$) so as to obtain in the transistor (10) output a derived signal ($S_t$) equal to a power N of the modulated signal, N being an integer greater than 1, and a filter for selecting the frequency component $f_m$ in the transistor output signal. The device can be used to demodulate an amplitude-modulated signal received by a scanner of a system identifying contactless portable objects.

5 Claims, 1 Drawing Sheet

DEVICE FOR DEMODULATING AN AMPLITUDE-MODULATED SIGNAL This application is a U.S. National Stage of International application PCT/FR00/02982, filed Oct. 26, 2000 and published on May 3, 2001 in the French Language.

TECHNICAL FIELD

The present invention relates to the demodulation of amplitude-modulated signals of the type received by a portable contactless object reader after amplitude modulation of the fundamental signal transmitted by the reader to the portable contactless object, and relates particularly to such a device having a low production cost.

BACKGROUND ART

At present, systems designed to identify portable contactless objects are widely used in numerous applications. One of these applications is the contactless ISO card which is being increasingly used in various sectors. In the transport sector, such cards have been developed to provide users with subscription possibilities and to simplify toll booth payment operations.

Portable objects having dimensions different than those of the ISO card have been considered, such as a small transport ticket, for example. These portable objects of varying dimensions require very different antennas and thus optimal distances between the reader and the object. These distances vary depending on the object. Furthermore, the presentation of various types of portable objects in front of the same reader may take place at a variable distance. In this manner, an ISO format card may be presented at a reading distance between 0 and 8 cm while a ticket type transport voucher requires that it be placed at a distance ranging from 0 to 3 cm.

While the contactless terminal or reader emits an amplitude-modulated signal having a constant factor (10%, for example), the contactless object responds by a signal having the same fundamental frequency, amplitude-modulated at a modulation factor which is not constant. The modulation factor is the ratio between the energy absorbed by the contactless object and the energy emitted by the reader. Unfortunately, while the energy emitted is constant, this is not the same for the energy absorbed, which depends on:

the distance between the contactless object and the terminal, the energy emitted by the terminal becoming weaker as the distance increases; the same holds true for the energy absorbed by the contactless object, and the size of the antenna enabling the object to be remotely powered and to communicate. For a given inductance, the higher the size of the antenna, the higher the absorption by the contactless object. The modulation factor thus varies depending on the position of the contactless object.

At present, several systems may be used to demodulate an amplitude-modulated signal. A traditional device allowing an amplitude-modulated signal to be demodulated uses peak detection and consists of a diode in series with a parallel RC circuit. While this system is relatively inexpensive, it has a drawback in that the values of R and C depend on the modulation factor. In other words, if this device is efficient for a given modulation factor, it becomes inefficient if the modulation factor varies as in the case of the abovementioned contactless systems.

Another demodulation device uses a mixer. It multiplies the amplitude-modulated fundamental signal by the unmodulated fundamental signal. After filtering, the modulating signal is isolated from the rest of the signal. Unlike the previous device, this device enables demodulation regardless of the modulation factor. However, it has the drawback of requiring, in addition to the mixer circuit (generally a transistor), a phase lock loop (PLL) which enables unmodulated phase generation of the fundamental signal. Unfortunately, the production cost of such a device is very high due to the fact that the cost of the phase lock loop is 100 times higher than that of the mixing circuit.

Finally, document WO/42948 describes a complex device for demodulating an amplitude-modulated signal by combining a first demodulator featuring 2 field effect transistors to act on a 100% modulated signal and a second modulator to act on a signal modulated less than 100%, this second modulator having not less than 7 field effect transistors.

SUMMARY OF THE INVENTION

The object of the invention is thus to supply a simple device for demodulating an amplitude-modulated signal regardless of the modulation factor applied during modulation.

Another purpose of the invention is to supply a device for demodulating an amplitude-modulated signal using only one transistor.

Yet another purpose of the invention is to supply a device for demodulating an amplitude-modulated signal transmitted by a contactless object to a reader in a contactless portable object identification system used as an access system in a transport network, for example.

The object of the invention is thus a device for demodulating a modulated signal resulting from the amplitude-modulation of a sinusoidal signal having a frequency $f_o$ using a signal having a frequency $f_m$ according to an unknown modulation factor, such a device featuring a transistor, the grid of which is connected to the modulated signal in order to obtain at the transistor's output a derivative signal equal to a power N (N being an integer greater than 1) of the modulated signal and a filter connected to the output of the transistor designed to select the frequency component $f_m$ in the transistor's output signal.

According to a preferred embodiment of the invention, the demodulation device features a field effect transistor, the signal of which includes a main component equal to the square of the input signal and an antiresonant circuit enabling the frequency component $f_m$ in the transistor's output signal to be selected.

BRIEF DESCRIPTION OF THE DRAWINGS

The objects, characteristics and advantages of the invention will become more apparent from the following description when taken in conjunction with the accompanying drawings in which.

DETAILED DESCRIPTION OF THE INVENTION

Figure 1:
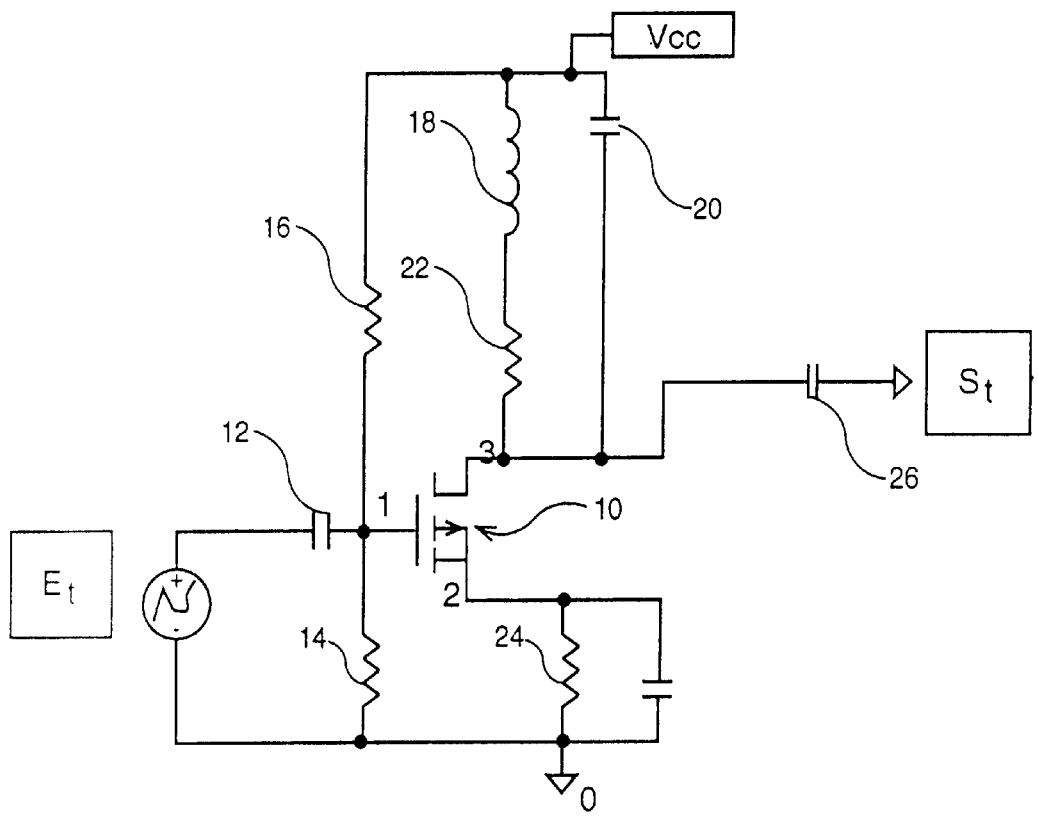
FIG. 1 is a representation of a preferred embodiment of the demodulation device according to the invention.

The electronic device illustrated in FIG. 1 represents a preferred embodiment of the invention in which an input signal $E_l$, resulting from an amplitude modulation of a fundamental signal having a frequency $f_o$ by a modulating signal having a frequency $f_m$, is applied to the grid (point 1) of a field effect transistor 10 by means of a capacitor 12 designed to eliminate the continuous component of the input signal.

The input signal is given by the equation:

$$E_t = [A \cos(2of_o t)] * [1 + m \cos(2of_m t)]$$

in which $f_o$ is the frequency of the fundamental signal (for example, 13.56 MHz) and $f_m$ is the frequency of the modulating signal (for example, 847 KHz).

It should be noted that the grid is polarized owing to the resistance points in series 14 and 16 between the potential 0 and the potential Vcc.

Depending on the technology employed (MOS transistor with N or P channel), the Vdc potential may be positive or negative without departing from the principle of the invention.

The drain current at the output of the transistor (point 3) is thus given by the equation:

$$I_d = (V_p + E_t)^2.$$

in which Idss is the transistor's saturation current and $V_p$ is the transistor's pinch-off current.

As a result, one of the terms of the equation is equal to:

$$E_t^2$$

if $E_t$ is replaced by its value and squared, we note that on of the terms is equal to:

$$A^2.m..\cos(2of_m t)$$

The transistor's output signal at point 3 is thus applied to an antiresonant circuit made up of the inductance 18 and the capacity 20, the values of which were selected so that this circuit is resonant at the frequency $f_m$. It should be noted that the resistance 22 in series with the inductance 18 forms part of the antiresonant circuit and has a value r, and the resistance 24 between point 2 of the transistor 10 and the potential 0 is used for transistor polarization.

The antiresonant circuit formed by the inductance 18 and the capacity 20 thus acts as a filter and enables the frequency component $f_m$ to be selected by means of the capacity 26 intended to eliminate the signal's continuous component. The equation for the output signal $S_t$ is thus:

$$S_t = R.A^2.m..\cos(2of_m t)$$

in which R=
and L.C.$(2of_m t)^2 = 1$

The transistor's quadratic characteristic comes from the characteristic of the transistor 10 (MOS, CMOS technology . . . ), and this type of transistor enables the best yield to be obtained. It may, however, originate from a nonlinearity of a bipolar transistor. The nonlinearity caused by bipolar transistors, due to high level input signals (1 volt, for example), is so high that much energy is lost in numerous harmonics. The bipolar transistor can thus be compared to a transfer function raising the input signal to a power N, and where the harmonic levels 0 to N are present.

Figure 2:
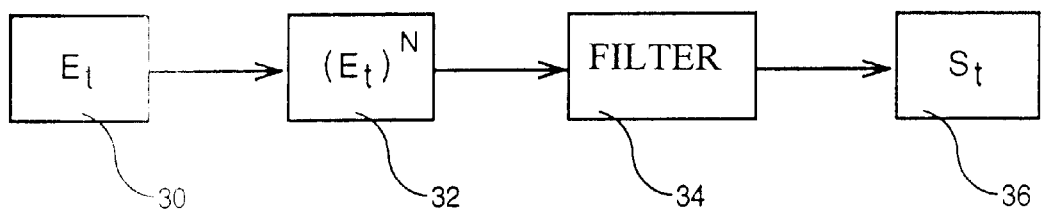
FIG. 2 is a schematic block diagram of the functions to be implemented in the demodulation device according to the invention.

By using this property, we can thus design a demodulating device as illustrated in FIG. 2, in which the input signal $E_t$ 30 is raised to the power N by a transistor 32. This signal is thus filtered by a filter to collect only an output signal $S_t$ 36 having the desired frequency $f_m$.

It should be noted that the filter 34 may be a pass-band filter insofar as the frequency signal $f_m$ is the signal of lowest frequency, the other components of the signal $E_t$ raised to the power N having either frequencies that are multiple of $f_m$, or frequencies near $f_o$ or a multiple of $f_o$, $f_o$ being much larger than $f_m$.

The transistors which may be used in the scope of the invention enable amplitude demodulation regardless of the modulation factor, with, however, a signal/noise ratio lower than a transistor with quadratic characteristics, which generate more harmonics.

The device described above may be used to demodulate the amplitude-modulated signal received by the reader of a contactless portable object identification system. It may also be used to demodulate an amplitude-modulated signal transmitted by the reader of such a system in the chip of a card or a ticket.

While the device according to the invention is preferably used in the scope of a contactless object identification system, it may be used everywhere where an amplitude-modulated signal for which the modulation factor is not exactly known must be demodulated, and at low cost.

What is claimed is:

1. A device for demodulating, in a reader, a fundamental signal having a frequency $f_o$ the amplitude of which is modulated by a signal having a frequency $f_m$ according to an unknown modulation factor, said modulated fundamental signal being received from a portable object, wherein said device includes a transistor, the grid of which is connected to said modulated fundamental signal ($E_t$) so as to obtain a derivative signal ($S_t$) at the output of said transistor having a value given by an equation wherein one term is proportional to a power N of said modulated fundamental signal, N being an integer greater than 1, and a filter designed to select the frequency component $f_m$ in the transistor's output signal.

2. The device according to claim 1, wherein said filter is a pass-band filter enabling the component having the frequency $f_m$ only to be selected in said output signal ($S_t$).

3. The device of claim 1, wherein said transistor is a field effect transistor, said derivative signal having a value given by an equation wherein one term is proportional to a power 2 of said modulated fundamental signal.

4. The device of claim 2, wherein said pass-band filter is an antiresonant circuit resonating at the frequency $f_m$.

5. The device of claim 1, wherein said transistor is a bipolar transistor which is capable of generating a nonlinearity for a high level input signal.

* * * * *